(12) United States Patent
Cardineau et al.

(10) Patent No.: US 12,071,449 B2
(45) Date of Patent: Aug. 27, 2024

(54) TIN DODECAMERS AND RADIATION PATTERNABLE COATINGS WITH STRONG EUV ABSORPTION

(71) Applicant: Inpria Corporation, Corvallis, OR (US)

(72) Inventors: Brian J. Cardineau, Corvallis, OR (US); William Earley, Corvallis, OR (US); Stephen T. Meyers, Corvallis, OR (US); Kai Jiang, Corvallis, OR (US); Jeremy T. Anderson, Corvallis, OR (US)

(73) Assignee: Inpria Corporation, Corvallis, OR (US)

( * ) Notice: Subject to any disclaimer, the term of this patent is extended or adjusted under 35 U.S.C. 154(b) by 0 days.

(21) Appl. No.: 17/840,844

(22) Filed: Jun. 15, 2022

(65) Prior Publication Data
US 2022/0324886 A1 Oct. 13, 2022

Related U.S. Application Data

(62) Division of application No. 16/375,032, filed on Apr. 4, 2019.

(Continued)

(51) Int. Cl.
| | | |
|---|---|---|
| *G03F 7/004* | (2006.01) | |
| *C07F 7/22* | (2006.01) | |
| *G03F 7/20* | (2006.01) | |

(52) U.S. Cl.
CPC .......... *C07F 7/2224* (2013.01); *G03F 7/0042* (2013.01); *G03F 7/2004* (2013.01)

(58) Field of Classification Search
CPC .............................. G03F 7/0042; C07F 7/2224
See application file for complete search history.

(56) References Cited

U.S. PATENT DOCUMENTS

| | | | |
|---|---|---|---|
| 9,310,684 B2 | 4/2016 | Meyers et al. | |
| 10,228,618 B2* | 3/2019 | Meyers | G03F 7/2004 |

(Continued)

FOREIGN PATENT DOCUMENTS

| | | |
|---|---|---|
| RU | 2317993 C1 | 2/2008 |
| TW | 2017-34025 A | 10/2017 |
| WO | 2017-006319 A1 | 1/2017 |

OTHER PUBLICATIONS

Cardineau et al., "Photolithographic properties of tin-oxo clusters using extreme ultraviolet light (13.5 nm)", Microelectronic Engineering, Apr. 24, 2014 (E-pub.), vol. 127, pp. 44-50.

(Continued)

*Primary Examiner* — John S Chu
(74) *Attorney, Agent, or Firm* — Christensen, Fonder, Dardi PLLC; Diane E. Bennett; Peter S. Dardi

(57) ABSTRACT

Patterning compositions are described based on organo tin dodecamers with hydrocarbyl ligands, oxo ligands, hydroxo ligands and carboxylato ligands. Alternative dodecamer embodiments have organo tin ligands in place of hydrocarbyl ligands. The organo tin ligands can be incorporated into the dodecamers from a monomer with the structure $(RCC)_3SnQ$, where R is a hydrocarbyl group and Q is a alkyl tin moiety with a carbon bonded to the Sn atom of the monomer and with a Sn bonded as a replacement of a quaternary carbon atom with bonds to 4 carbon atoms. Some or all of the carboxylato and hydroxyl ligands can be replaced with fluoride ions. Good EUV patterning results are obtained with the dodecamer based patterning compositions.

24 Claims, 9 Drawing Sheets

Related U.S. Application Data

(60) Provisional application No. 62/653,043, filed on Apr. 5, 2018.

(56) References Cited

U.S. PATENT DOCUMENTS

| | | | |
|---|---|---|---|
| 10,642,153 B2* | 5/2020 | Meyers | G03F 7/0042 |
| 10,787,466 B2 | 9/2020 | Edson et al. | |
| 10,975,109 B2 | 4/2021 | Edson et al. | |
| 11,098,070 B2 | 8/2021 | Cardineau et al. | |
| 11,392,028 B2 | 7/2022 | Cardineau et al. | |
| 2016/0116839 A1 | 4/2016 | Meyers et al. | |
| 2017/0102612 A1 | 4/2017 | Meyers et al. | |
| 2017/0146909 A1 | 5/2017 | Smith et al. | |
| 2017/0256418 A1 | 7/2017 | Chang et al. | |
| 2019/0137870 A1 | 5/2019 | Meyers et al. | |
| 2019/0153001 A1 | 5/2019 | Cardineau et al. | |
| 2019/0369489 A1 | 12/2019 | Meyers et al. | |
| 2020/0064733 A1 | 2/2020 | Meyers et al. | |
| 2022/0324886 A1 | 10/2022 | Cardineau et al. | |

OTHER PUBLICATIONS

Chandrasekhar et al., "Organotin assemblies containing Sn-O bonds", Coordination Chemistry Reviews, Dec. 1, 2002, vol. 235, pp. 1-5.
Chandrasekhar et al., "Organotin Cages, {[(n-BuSn)3(μ3-O)(OC6H4-4-X)]2(HPO3]4}, X = H, Ci, Br, and I, in Double O-Capped Structures: Halogen-Bonding-Mediated Supramolecular Formation," Organometallics 2005, vol. 24, 4926-4932.
Corey et al., "Preparation of trans-1,2-Bis (tri-n-butylstannyl) ethylene", The Journal of Organic Chemistry, Dec. 1, 1975, vol. 40, No. 25, pp. 3788-3789.
Dakternieks et al., "Synthesis, structure and reactions of [(BuSn)12O14(OH)6]Cl2.2H2O: solution studies using 119Sn NMR and electrospray mass spectrometry", Journal of Organometallic Chemistry, Aug. 9, 1994, vol. 476, No. 1, pp. 33-40.
Day et al., "A New Structural Form of Tin in an Oxygen-Capped Cluster", J. Am. Chem. Soc. 1987, vol. 109, 940-941.
Eyechenne-Baron et al., "New synthesis of the nanobuilding block {(BuSn)12O14(OH)6}2+and exchange properties of {(BuSn)12O14(OH)6}(O3SC6H4CH3)2," J. Organometallic Chemistry 1998, 567, 137-142.
Mack, "Fundamental Principles of Optical Lithography", John Wiley & Sons, Chichester, U.K; pp. 271-272, 2007.
Puff et al., "Zur hydrolyse von monoorganylzinn-trihalogeniden (III. Isolierung und Rontgenstrukturanalyse von Verbindungen mit dem nueartigen Käfig-ion [(i-PrSn)12O14(OH)6+2]", J. Organometallic Chemistry 1989, 373, 173-184.
Renaldo et al., "Palladium-Catalyzed Coupling of Acid Chlorides With Organotin Reagents: Ethyl (E)-4-(4-NITROPHENYL)-4-OXO-2-BUTENOATE", Organic Syntheses, 1989, vol. 67, p. 86. internal pp. 1-8.
Reuter et al., "On the structural diversity anions coordinate to the butterfly-shaped [(R2Sn)3O(OH)2]2+ cations and vice versa", Canadian Journal of Chemistry, vol. 92, pp. 496-507, (Jan. 2014).
Schumann et al., "Synthesis and characterization of some organo-all-tin dendrimers with different peripheral substituents", Journal of Organometallic Chemistry 691, p. 1703-1712, (2006).
International Standard ISO 21348 (2007).
International Search Report and Written Opinion For International Application No. PCT/US2019/025739 dated Oct. 31, 2019.
International Union of Pure and Applied Chemistry, "Copendium of Chemical Terminology (IUPAC)", Gold Book, p. 694-695 of 1622, (2012).
Kuan et al., "Hexameric isopropyloxotin acetate chloroform tetrasolvate", Acta Crystallographica, Section E: Structure Reports Online, vol. 58 No. 6, p. m301-m303, (2002).
Nagabrahmanandachari et al., "Reaction of n-butyltin dihydroxy chloride with carboxylic and phosphinic acids: crystal structures of the ladder [{Sn(n-Bu)(O2CCHPh2)}3Cl2O2]2 and the unsolvated cluster [{Sn(n-Bu)(O2PPH2)Cl2} {Sn(n-Bu)(O2PPH2)2(OH)}]2", Main Group Chemistry, vol. 21 No. 12, p. 789-802, (Dec. 1, 1998).
Prabusankar et al., "Sn3 and Sn10 sulfonate-oxide-hydroxide clusters with two different sulfonate binding modes", Dalton Transactions, vol. 29, p. 3121-3123, (2007).
Schmid et al., "Oxygen—and sulfur-capped organotin clusters", Phosphorus, Sulfur and Silicon and the Related Elements, vol. 41 No. 1-2, p. 69-74, (1989).
Office Action from corresponding Taiwan Patent Application No. 111132226 dated Feb. 17, 2023.
Office Action from corresponding Korean Patent Application No. 10-2020-7028850 dated Feb. 20, 2023.

* cited by examiner

TIN DODECAMERS AND RADIATION PATTERNABLE COATINGS WITH STRONG EUV ABSORPTION

CROSS REFERENCE TO RELATED APPLICATIONS

This application is a divisional of the co-pending U.S. patent application Ser. No. 16/375,032 filed on Apr. 4, 2019 to Cardineau et al., entitled "Tin Dodecamers and Radiation Patternable Coatings with Strong Euv Absorption", which claims priority to corresponding U.S. provisional patent application 62/653,043 filed on Apr. 5, 2018 to Cardineau et al., entitled "Photoresists With Strong EUV Adsorption," incorporated herein by reference.

FIELD OF THE INVENTION

The invention relates to alkyl tin clusters suitable for formation of radiation patternable coatings. The invention further relates to alkyl ligands with tin atoms incorporated into the ligands.

BACKGROUND OF THE INVENTION

Extreme ultraviolet (EUV) lithography is a method to manufacture high-performance integrated circuits that contain high-density structures patterned on a nanometer scale. To fabricate these circuits, a photoresist is deposited on a substrate and exposed to a pattern of EUV light. Exposed regions undergo radiolysis and a solubility change, which enable the EUV photopattern to be precisely transferred to the resist after solvent development and additional processing. The developed photoresist pattern is then passed on to the underlying substrate via an etch process.

The processing of semiconductor circuits and devices has involved the continued shrinkage of critical dimensions over each generation. As these dimensions shrink, new materials and methods can be called upon to meet the demands of processing and patterning smaller and smaller features. Patterning generally involves selective exposure of a thin layer of a radiation sensitive material (resist) to form a pattern that is then transferred into subsequent layers or functional materials. Promising new classes of metal-based radiation resists have been discovered that are especially suitable for providing good absorption of extreme ultraviolet (EUV) light and electron beam radiation, while simultaneously providing very high etch contrast. To obtain smaller patterned features, EUV has been tracked to become a significant tool in semiconductor processing, and resist compositions able to exploit the EUV advantages can be a valuable component to this effort.

SUMMARY OF THE INVENTION

In a first aspect, the invention pertains to a composition comprising a tin dodecamer represented by the formula $(QSn)_{12}O_{14}(OH)_6(RCO_2)_2$, where R is H or an alkyl group with 1 to 10 carbon atoms, Q is a hydrocarbyl group with 3 to 31 total carbon atoms, or Q is an alkyltin group with a structure $—(CH_2)_nSn(R_1R_2R_3)$ with n=1 to 4 and with 4 to 15 total carbon atoms, and $R_1$, $R_2$, and $R_3$ are independently alkyl groups with 1 to 5 carbon atoms. In some embodiments, a solution for forming a radiation patternable coating can comprise an organic solvent and this composition comprising the tin dodecamer.

In a further aspect, the invention pertains to a composition comprising a tin compound represented by the formula $(RCC)_3SnQ$, where R is a hydrocarbyl group with 1 to 15 carbon atoms and Q is an alkyltin group with a structure $—(CH_2)_nSn(R_1R_2R_3)$ with 4 to 15 total carbon atoms, n=1 to 4, and $R_1$, $R_2$, and $R_3$ are independently alkyl groups with 1 to 5 carbon atoms.

In additional aspects, the invention pertains to a method of forming an organo tin compound, in which the method comprises:

gradually adding tin dihalide to a solution comprising an organic solvent, alkylacetylene, alkylmagnesium halide to form a tin intermediate solution; and combining $XCH_2Sn(R_1R_2R_3)$, where X is a halide and $R_1$, $R_2$, and $R_3$ are independently alkyl groups with 1 to 5 carbon atoms, to the tin intermediate solution to form a solid compound, $(RCC)_3SnCH_2Sn(R_1R_2R_3)$.

In other aspects, the invention pertains to a composition comprising $(QSn)_nO_{3n/2-1/2x-1/2y}F_x(OH)_y$, $1 \leq n \leq 12$, ($0 < x+y \leq 8$) wherein Q is an alkyl group with 1 to 16 carbon atoms or an alkyltin group with a structure $—CH_2Sn(R_1R_2R_3)$ with 4 to 15 total carbon atoms, and $R_1$, $R_2$, and $R_3$ are independently alkyl groups with 1 to 5 carbon atoms. In some embodiments, a solution for forming a radiation patternable coating can comprise an organic solvent and this composition comprising the fluorinated tin dodecamer.

In another aspect, the invention pertains to a method to fluorinate a dodecamer tin composition represented by the formula $(QSn)_{12}O_{14}(OH)_6(HCO_2)_2$, where Q is an alkyl group with 5 to 16 total carbon atoms, or Q is an alkyltin group with a structure $—(CH_2)_nSn(R_1R_2R_3)$ with n=1 to 4 and with 4 to 15 total carbon atoms, and $R_1$, $R_2$, and $R_3$ independently alkyl groups with 1 to 10 carbon atoms, in which the method comprises the step of reacting an alkyl tin hydroxide with trialkylamine trihydrofluoride.

BRIEF DESCRIPTION FO THE DRAWINGS

DETAILED DESCRIPTION OF THE INVENTION

Figure 1:
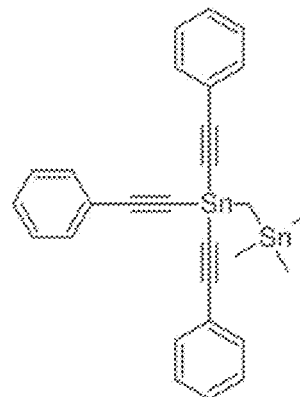
FIG. 1 is a line drawing depiction of the chemical formula for $(C_6H_5CC)_3SnCH_2Sn(CH_3)_3$.

Alkyl tin clusters provide promising characteristics for radiation based patterning, and dodecamers of tin described herein are appropriately processible for tin EUV patterning.

A synthesis approach is described herein to synthesize the dodecamers from alkyl tin triacetylide monomers. Also, alkyl groups with tin ligands are described herein that can be used to convert the triacetylide monomer effectively into dodecamer embodiments with additional tin atoms also in the ligands. The tin dodecamers have oxo, hydroxo and formate ligands in which some of the ligands are bridging to stabilize the clusters. Methods to substitute fluoride ions for formate and/or hydroxide ligands are disclosed. The tin dodecamer clusters are solid compounds that are soluble in suitable organic liquids. Patterning formulations are described based on the solubilized tin dodecamers. Based on the higher tin content of these tin clusters, coatings formed from the tin compositions have high EUV absorption.

EUV sources generally produce lower light intensities than other DUV and UV laser systems and lamps employed for lithography. Under this lower illumination, the random nature of EUV shot noise and chemical reactions in the photoresist may contribute to formation of undesired defects in the resist pattern. These stochastic events are less consequential in photoresists that strongly absorb EUV radiation and undergo chemical changes that efficiently deliver higher solubility contrast between exposed and unexposed regions.

Thin photoresists produce the highest fidelity patterns for transfer to an underlying substrate. Consequently, an effective EUV photoresist should have a very high EUV absorption cross section to enable both improvements in defectivity and writing speeds. Meyers et al. describe in U.S. Pat. No. 9,310,684, entitled "Organometallic Solution Based High Resolution Patterning Compositions", incorporated herein by reference, new organotin photoresist compositions with high absorption coefficients for EUV lithography. Solution coating and film compositions comprise tin bound by alkyl groups and further bridged by oxo (O) and/or hydroxo (—OH) groups. Herein, we describe new compositions exemplified by substitution of C, O, and —OH groups with stronger EUV absorbing species. A carbon atom, C, in the alkyl chains may be substituted with Sn, and O and —OH may be substituted with F. Comparison of the cross sections in Table 1 shows that these substitutions can produce higher EUV absorption based on reported atomic absorption data (http://henke.lbl.gov/optical_constants/pert_form.html). In Table 1, absorptions are reported in units of $cm^2/atom$, at 13.5 nm EUV light.

TABLE 1

| C | Sn | O | F |
|---|----|---|---|
| $5.83 \times 10^{-19}$ | $1.82 \times 10^{-17}$ | $2.10 \times 10^{-18}$ | $3.25 \times 10^{-18}$ |

Substitution of an OH group with F also limits the condensation that can occur when hydroxo tin species combine to eliminate $H_2O$. This suppression of condensation can enhance photoresist solution stability and patterning-performance reproducibility.

Tin clusters have been synthesized that offer the promise of providing high EUV absorption while maintaining good coating properties and solution processing. Tin trimers and other clusters have been previously described in copending U.S. patent application Ser. No. 16/194,491 to Cardineau et al. (hereinafter the '491 application), entitled "Organotin Clusters, Solutions of Organotin Clusters, and Application to High Resolution Patterning," incorporated herein by reference. The '491 application teaches the use of alkyl tin trialkylacetylide monomers, specifically alkyl tin triphenylacetylide monomers, for cluster formation. In some embodiments, these monomers are used to form the dodecamers described herein. Tin dodecamers with a useful structure for resist processing, including two exemplified tin dodecamers, are described that provide high EUV absorption.

The dodecamer $(QSn)_{12}O_{14}(OH)_6(RCO_2)_2$ (Q=alkyl or alkyl tin ligand and R=alkyl group or H) is an exemplary organotin cluster formulated as a metal oxide EUV photoresist. Also, the carboxylate, e.g., formate, and optionally some or all of the hydroxide ligands can be substituted by fluoride ions, as described below. The Q ligand generally can have a quaternary carbon atom or tin atom. For the alkyl groups with a quaternary carbon atom, these alkyl groups have been found generally to form desirable patterning coatings, and these ligands generally can have from 5 to 17 carbon atoms. The alkyl tin ligands have a tin atom replacing a quaternary carbon of an analogous alkyl group, and can comprise from four to 16 carbon atoms. The ligands having quaternary carbons that are replaced with Sn still provide a C—Sn bond of the dodecamer in the formula above to form a Sn—$(CH_2)_n$—Sn moiety, where n is 1 to 4. The substitution of a quaternary carbon can be advantageous for EUV lithography, as Sn has an EUV absorption cross section greater than C (see Table 1).

The synthesis of tin clusters $(BuSn)_{12}O_{14}(OH)_6^{+2}$ and $(i-PrSn)_{12}O_{14}(OH)_6^{+2}$ are described, respectively, in Eychenne-Baron et al. (hereinafter Eychenne-Baron), "New synthesis of the nanobuilding block $\{(BuSn)_{12}O_{14}(OH)_6\}^{2\pm}$ and exchange properties of $\{(BuSn)_{12}O_{14}(OH)_6\}(O_3SC_6H_4CH_3)_2$," J. Organometallic Chemistry 1998, 567, 137-142 and Puff et al. (hereinafter Puff), "Zur hydrolyse von monoorganylzinn-trihalogeniden (III. Isolierung and Rontgenstrukturanalyse von Verbindungen mit dem nueartigen Käfig-ion $[(i-PrSn)_{12}O_{14}(OH)_6^{+2}]$," J. Organometallic Chemistry 1989, 373, 173-184, both of which are incorporated herein by reference. Very distinct synthesis processes are described herein that provide for the formation of the compositions described above with the sterically bulky neopentyl based alkyl ligands (optionally substituted with a quaternary tin atoms) as well as the introduction of formate anions, which have been found to adequately stabilize the clusters.

Puff describes the isolation of their compound with chloride anions and associated solvent molecules (water or water with DMF (dimethylformamide) or DMPU (N,N'-dimethylpropyleneurea). Eychenne-Baron explored the substitution of the as-synthesized compound with p-toluene sulfonyl anions and succeeded in the partial substitution of the group with an acetate group. The current synthesis approach provides the ability to prepare the dodecamer as the formate salt and with alternative alkyl substituents.

It has been found that moderate sized branched alkyl ligands provide good patterning performance. The simplest alkyl group with a quaternary C* atom has a neopentyl $(CH_3)_3C^*CH_2$-structure, which can be referred to as a t-amyl group. This neopentyl moiety can be generalized as $(R_1R_2R_3)C^*(CH_2)_n$—, where n is an integer from 1 to 4 (i.e., 1, 2, 3 or 4), although generally the C* will just be written as C with the "*" just being used to introduce the concept of the quaternary carbon. The generalized group maintains the same ligand bonding with a potentially expanded alkyl structure. Generally, the $R_1$, $R_2$, $R_3$ moieties can independently be groups with 1 to 5 carbon atoms, such as methyl ($CH_3$—), ethyl ($CH_3CH_2$—), etc. The quaternary C* may be replaced with Sn to form the corresponding alkyltin ligand $(CH_3)_3SnCH_2$— or generally $(R_1R_2R_3)Sn(CH_2)_n$—, where n is an integer from 1 to 4 and $R_1$, $R_2$, $R_3$ are as above. Other branched alkyl groups can be desirable, such as tert-butyl (($CH_3$)$_3$C—) groups, sec-butyl ($CH_3CHCH_2CH_3$), iso-butyl (($CH_3$)$_2CHCH_2$-, isopropyl (($CH_3$)$_2$CH—), and in some embodiments, non-branched alkyl groups may be desirable, such as methyl, ethyl, propyl, butyl, pentyl, and larger groups.

The ligands with the quaternary carbon or tin centers are found herein to be useful to bind to a Sn atom to form monomers for ultimate dodecamer synthesis. The monomers generally have the structure $QSn(C_6H_5CC)_3$, where Q in the phenylacetylide becomes the alkyl or alkyl tin ligand of the cluster. The monomer $(CH_3)_3SnCH_2Sn(C_6H_5CC)_3$ is exemplified below, which is believed to be the first example of a monoalkyl oxo-hydroxo tin species with Sn substituted for C in the alkyl group. This monomer can be generalized with the use of other alkyl ligand substituents as $(C_6H_5CC)_3Sn(CH_2)_nC(R_1R_2R_3)$ with 5 to 16 total carbon atoms in the —$(CH_2)_nC(R_1R_2R_3)$ ligand, or $(C_6H_5CC)_3Sn(CH_2)_nSn(R_1R_2R_3)$ with 4 to 15 total carbon atoms in the —$(CH_2)_nSn(R_1R_2R_3)$ ligand, where n=1, 2, 3, or 4 and $R_1$, $R_2$, and $R_3$ are independently linear or branched alkyl groups with 1 to 5 carbon atoms. Also, the trialkylacetylide monomer can be generalized with other substituents as $(R'CC)_3SnQ$, where R' is an organo group with 1 to 15 carbon atoms, such as an alkyl group, alkenyl group, an aromatic group, corresponding halogenated version or derivatives thereof.

The trialkylacetylide monomer described above hydrolyzes and condenses under appropriate conditions to form the dodecamer $(QSn)_{12}O_{14}(OH)_6(HCO_2)_2$, in which Q can comprise a tin atom. Solutions in organic solvents of this dodecamer can be readily spin coated or otherwise appropriately processed to deposit thin films. The films with the alkytin ligands are predicted to absorb approximately 1.5 times the number of EUV photons compared with the corresponding neopentyl system based on reported atomic EUV absorption cross sections, a 25-nm film thickness, and a packing density comparable to neopentyl tin dodecamer films. Analysis of a corresponding EUV exposure array reveals desirable performance as described in the Examples below. The dodecamer compounds are solids and are generally crystalline. The crystal structure of $((CH_3)_3CSn)_{12}O_{14}(OH)_6(HCO_2)_2$ is presented in the examples below.

Each R (alkyl) group is bound to the tin atom individually and generally has from 1 to 31 carbon atoms, with 3 to 31 carbon atoms for a group with a secondary-bonded carbon atom and 4 to 31 carbon atoms for a group with a tertiary-bonded carbon atom, although in some embodiments each R group can have no more than 20 carbon atoms, and in further embodiments no more than 15 carbon atoms. A person of ordinary skill in the art will recognize that additional ranges of carbon numbers within the explicit ranges above are contemplated and are within the present disclosure. In particular, branched alkyl ligands can be desirable for some patterning compositions where the R—Sn portion of the cluster can be represented as $R^1R^2R^3CSn$, where $R^1$ and $R^2$ are independently an alkyl group with 1-10 carbon atoms, and $R^3$ is hydrogen or an alkyl group with 1-10 carbon atoms. In some embodiments $R^1$ and $R^2$ can form a cyclic alkyl moiety, and $R^3$ may also join the other groups in a cyclic moiety. Suitable branched alkyl ligands can be, for example, isopropyl ($R^1$ and $R^2$ are methyl and $R^3$ is hydrogen), tert-butyl ($R^1$, $R^2$ and $R^3$ are methyl), tert-amyl ($R^1$ and $R^2$ are methyl and $R^3$ is —$CH_2CH_3$), sec-butyl ($R^1$ is methyl, $R^2$ is —$CH_2CH_3$, and $R^3$ is hydrogen), neopentyl ($R^1$ and $R^2$ are hydrogen, and $R^3$ is —$C(CH_3)_3$), cyclohexyl, cyclopentyl, cyclobutyl, and cyclopropyl. Examples of suitable cyclic groups include, for example, 1-adamantyl (—$C(CH_2)_3(CH_2)_3$ or tricyclo(3.3.1.13,7) decane bonded to the metal at a tertiary carbon) and 2-adamantyl (—$CH(CH)_2(CH_2)_4(CH)_2(CH_2)$ or tricyclo(3.3.1.13,7) decane bonded to the metal at a secondary carbon). In other embodiments, hydrocarbyl groups may include aryl or alkenyl groups, for example, benzyl or allyl, or alkynyl groups. In other embodiments, the hydrocarbyl ligand R may include any group consisting solely of C and H and containing 1-31 carbon atoms. For example: linear or branched alkyl (i-Pr(($CH_3$)$_2$CH—), t-Bu (($CH_3$)$_3$C—), Me ($CH_3$—), n-Bu ($CH_3CH_2CH_2CH_2$—)), cyclo-alkyl (cyclo-propyl, cyclo-butyl, cyclo-pentyl), olefinic (alkenyl, aryl, allylic), or alkynyl groups, or combinations thereof. In further embodiments suitable R groups may include hydrocarbyl groups substituted with hetero-atom functional groups including cyano, thio, silyl, ether, keto, ester, or halogenated groups, or combinations thereof.

The synthesis of triacetylide tin monomers is discussed in the '491 application cited above as well as in the Examples below. As noted above, the monomer is an alkyl or alkyltin tin trialkylacetylide. Specifically, the '491 application describes the synthesis of t-butyl tin triphenylacetylide based on the reaction of phenylacetylene with t-butyl tin tris(dimethylamide). In general, an alkyltin acetylide can be synthesized by addition of alkyl acetylide anion (R'C≡C$^-$) to $RSnCl_3$, addition of alkyl anion to $Sn(C≡CR'')_4$ or reaction of HC≡CR'' with $RSn(NR''')_2)_3$. Acetylide anions can be formed with a super base to form a compound with an appropriate cation, RC≡CM, where M can be lithium, sodium, potassium, magnesium halide [MgX]$^+$, zinc halide [ZnX]$^+$ (X=halide), or other ion with an electropositive metal.

With respect to the synthesis of the alkyltin tin trialkylacetylide in the examples herein, the reaction can be performed using an alkylacetylene, such as phenylacetylene, that is reacted in an organic solvent with a super base, such as isopropyl magnesium chloride, to form the organometallic alkylacetylide. Suitable organic solvents include tetrahydrofuran and other polar nonreactive solvents, which generally are aprotic. After reacting the alkylacetylene with the super base, tin dihalide dissolved in an organic solvent is added and the solution is reacted for at least an hour at room temperature. The (haloalkyl)trialkyl stannane is then added to the reaction mixture, and further reaction is carried out for at least five minutes, which can be performed at room temperature. The haloalkyl group becomes the —$(CH_2)_n$ moiety of the monomer, and the trialkyl groups of the stannane become the $R_1$, $R_2$, $R_3$ moieties of the monomer, using the notation above. The product alkyltin tin trialkylacetylide forms a solid precipitate that can be collected and washed. The product can be further crystallized by recrystallization from a hydrocarbon solvent such as pentane or hexanes.

The synthesis of dodecamers is driven initially through the addition of a small amount of water to an organic solution of the monomer. Suitable organic solvents include, but are not limited to, alcohols or tetrahydrofuran, although generally many organic solvents should be suitable. The water is added in an approximately stoichiometric amount to provide one water molecule for each alkylacetylide ligand. This initial reaction is carried out for at least an hour, and can be carried out for several days at room temperature, with a reaction for three days carried out in the examples. It is believed that this initial reaction involves formation of the dodecamer in a hydroxide form. After completing this initial reaction, carboxylic acid is added to the product of the initial reaction, and the solution may or may not be heated to boiling prior to the addition of the carboxylic acid. The Examples below are performed with formic acid. The carboxylic acid can be added, generally gradually, in an approximately stoichiometric amount. After addition of the formic acid, the solution is stirred for an additional time, generally at least a minute or more. The resulting solid product can be collected and washed. It may be desired to recrystallize the product.

Fluoride ions may be substituted for formate ions and/or hydroxide ions or portions thereof in the dodecamer $(t-BuSn)_{12}O_{14}(OH)_6(HCO_2)_2$, or more generally for the dodecamer $(QSn)_{12}O_{14}(OH)_6(HCO_2)_2$, by reaction with trialkylamine trihydrofluoride, such as triethyl amine $[(CH_2CH_2)_3N·3HF]$, where Q is an alkyl or tinalkyl ligand as specified as above. Ammonium bifluoride ($NH_4HF_2$) or other HF sources can be used as an alternative to the trialkylamine trihydrofluoride. An example below describes replacement of the six hydroxides and two formates with eight fluorides by reaction with triethylamine trihydrofluoride to form the dodecamer $(t-BuSn)_{12}O_{14}F_8$. This substitution is believed to have been previously unknown in the chemistry of monoalkyl oxo-hydroxo tin dodecamers. Chemical and NMR analyses confirm the complete substitution of fluoride for hydroxide and formate. Mass spectral analysis shows partial substitution can also occur. Solutions in suitable organic solvents of the fluoride dodecamer may be spin coated as thin films suitable for EUV exposure. Analysis of an exposure array reveals excellent performance as descried in the examples below.

The use of alkyl substituted metal coordination compounds in high performance radiation based patterning compositions is described, for example, in U.S. Pat. No. 9,310,684 to Meyers et al., entitled "Organometallic Solution Based High Resolution Patterning Compositions," incorporated herein by reference. Refinements of these organometallic compositions for patterning are described in published U.S. patent applications 2016/0116839 A1 to Meyers et al., entitled "Organometallic Solution Based High Resolution Patterning Compositions and Corresponding Methods," and 2017/0102612 A1 to Meyers et al., entitled "Organotin Oxide Hydroxide Patterning Compositions, Precursors, and Patterning," both of which are incorporated herein by reference. The organometallic compositions in these references have structures based on single metal moieties. The metal clusters described herein comprise bridging groups between two or three metal atoms. The metal cluster based compositions can be effectively used for patterning and have likely processing advantages.

To form a resist precursor solution, the cluster composition can be dissolved in a suitable organic solvent. Solubility has been found in chloroform, ketones, alcohols and a range of polar organic solvents. Alcohols may be one or more of 1-methoxy-2-propanol, 4-methyl-2-pentanol, cyclopentanol, methanol, ethanol, n-propanol, or isopropanol, mixtures thereof or the like. Suitable alcohols include, for example, alkoxy alcohols with four to ten carbon atoms. Suitable solvents also include, for example, propylene glycol methyl ether acetate and the like. The alkyltin dodecamer compositions also dissolve in solutions with one or more of polar ethers, such as tert-butyl methyl ether and anisole, ethyl lactate, cyclic ethers, such as tetrahydrofuran, or the like. Other organic solvents may also be suitable based on the identified solvents noted above. Tin concentrations can be in the range of about 1 mM to about 1 M, in further embodiments from about 2 mM to about 750 mM, and in other embodiments from about 5 mM to about 500 mM by amount of tin. For most solvents, it can be desirable to add carboxylic acid to the solution to stabilize the cluster composition with its carboxylate anion. Formic acid or other carboxylic acid can be added as a stabilizer in concentrations of about 1%-30% v/v and in further embodiments from about 5% to 20% v/v, which is the added volume per total volume of the mixture. In general, organic solvent selection can be influenced by solubility parameters, volatility, flammability, toxicity, viscosity and potential chemical interactions with other processing materials. A person of ordinary skill in the art will recognize that additional ranges of concentrations within the explicit ranges above are contemplated and are within the present disclosure. In general, precursor solutions can be well mixed using appropriate mixing apparatuses suitable for the volume of material being formed.

Suitable filtration can be used to remove any contaminants or other components that do not appropriately dissolve.

A coating material can be formed through deposition and subsequent processing of the precursor solution onto a selected substrate. Using the precursor solutions described herein, some hydrolysis and condensation may take place during coating, and may be completed or furthered post coating via subsequent processing steps such as heating in air. A substrate generally presents a surface onto which the coating material can be deposited, and the substrate may comprise a plurality of layers in which the surface relates to an upper most layer. In some embodiments, the substrate surface can be treated to prepare the surface for adhesion of the coating material. Also, the surface can be cleaned and/or smoothed as appropriate. Suitable substrate surfaces can comprise any reasonable material. Some substrates of particular interest include, for example, silicon wafers, silica substrates, other inorganic materials such as ceramic materials, polymer substrates, such as organic polymers, composites thereof and combinations thereof across a surface and/or in layers of the substrate. Wafers, such as relatively thin cylindrical structures, can be convenient, although any reasonable shaped structure can be used. Polymer substrates or substrates with polymer layers on non-polymer structures can be desirable for certain applications based on lithographic performance or substrate cost and flexibility, and suitable polymers can be selected based on the relatively low processing temperatures that can be used for the processing of the patternable materials described herein. Suitable polymers can include, for example, polycarbonates, polyimides, polyesters, polyalkenes, copolymers thereof and mixtures thereof. In general, it is desirable for the substrate to have a flat surface, especially for high resolution applications. However, in specific embodiments the substrate may possess substantial topography, where the resist coating is intended to fill or planarize features for particular patterning applications.

In general, any suitable solution coating process can be used to deliver the precursor solution to a substrate. Suitable coating approaches can include, for example, spin coating, spray coating, dip coating, knife edge coating, vapor deposition, such as chemical vapor deposition (CVD) or atomic layer deposition (ALD) methods, printing approaches, such as inkjet printing and screen printing, and the like. Some of these coating approaches form patterns of coating material during the coating process, although the resolution available currently from printing or the like has a significantly lower level of resolution than available from radiation based patterning as described herein.

If patterning is performed using radiation, spin coating can be a desirable approach to cover the substrate relatively uniformly, although there can be edge effects. In some embodiments, a wafer can be spun at rates from about 500 rpm to about 10,000 rpm, in further embodiments from about 1000 rpm to about 7500 rpm and in additional embodiments from about 2000 rpm to about 6000 rpm. The spinning speed can be adjusted to obtain a desired coating thickness. The spin coating can be performed for times from about 5 seconds to about 5 minutes and in further embodiments from about 15 seconds to about 2 minutes. An initial low speed spin, e.g. at 50 rpm to 250 rpm, can be used to perform an initial bulk spreading of the composition across the substrate. A back side rinse, edge bead removal step, or the like can be performed with water or other suitable solvent to remove any edge bead. A person or ordinary skill in the art will recognize that additional ranges of spin coating parameters within the explicit ranges above are contemplated and are within the present disclosure.

The thickness of the coating generally can be a function of the precursor solution concentration, viscosity, and the spin speed for spin coating. For other coating processes, the thickness can generally also be adjusted through the selection of the coating parameters. In some embodiments, it can be desirable to use a thin coating to facilitate formation of small and highly resolved features in the subsequent patterning process. For example, the coating materials after drying can have an average thickness of no more than about 10 microns, in other embodiments no more than about 1 micron, in further embodiments no more than about 250 nanometers (nm), in additional embodiments from about 1 nanometers (nm) to about 50 nm, in other embodiments from about 2 nm to about 40 nm and in some embodiments from about 3 nm to about 35 nm. A person of ordinary skill in the art will recognize that additional ranges of thicknesses within the explicit ranges above are contemplated and are within the present disclosure. The thickness can be evaluated using non-contact methods of X-ray reflectivity and/or ellipsometry based on the optical properties of the film. In general, the coatings are relatively uniform to facilitate processing. In some embodiments, the variation in thickness of the coating varies by no more than ±50% from the average coating thickness, in further embodiments no more than ±40% and in additional embodiments no more than about ±25% relative to the average coating thickness. In some embodiments, such as high uniformity coatings on larger substrates, the evaluation of coating uniformity may be evaluated with a 1 centimeter edge exclusion, i.e., the coating uniformity is not evaluated for portions of the coating within 1 centimeter of the edge. A person of ordinary skill in the art will recognize that additional ranges within the explicit ranges above are contemplated and are within the present disclosure.

The coating process itself can result in the evaporation of a portion of the solvent since many coating processes form droplets or other forms of the coating material with larger surface areas and/or movement of the solution that stimulates evaporation. The loss of solvent tends to increase the viscosity of the coating material as the concentration of the species in the material increases. An objective during the coating process can be to remove sufficient solvent to stabilize the coating material for further processing. Coating species may react with air, hydrolyze, or condense during coating or subsequent heating to form a chemically modified coating material.

In general, the coating material can be exposed to, and optionally heated in, the presence of atmospheric moisture prior to radiation exposure to hydrolyse the hydrolysable bonds to the metal in the precursor compositions, and/or further drive off solvent and promote densification of the coating material. The coating material following in situ hydrolysis may generally form a polymeric metal oxo-hydroxo and/or carboxylato network based on the binding of oxo-hydroxo and/or carboxylato ligands to the metals in which the metals also have some alkyl ligands, or a molecular solid comprised of polynuclear metal oxo/hydroxo and/or carboxylato species with alkyl ligands.

The hydrolysis/solvent removal process may or may not be quantitatively controlled with respect to precise stoichiometry of the heated coating material and/or specific amounts of solvent remaining in the coating material. Additionally, the formulas and compositions expressed herein may contain some additional water, whether directly bound to Sn, or as hydrogen-bonded component of the network. Empirical evaluation of the resulting coating material properties generally can be performed to select processing conditions that are effective for the patterning process. While heating may not be needed for successful application of the process, it can be desirable to heat the coated substrate to speed the processing and/or to increase the reproducibility of the process and/or to facilitate vaporization of hydrolysis byproducts. In embodiments in which heat is applied to remove solvent in a pre-exposure bake, the coating material can be heated to temperatures from about 45° C. to about 250° C. and in further embodiments from about 55° C. to about 225° C. The heating for solvent removal can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of heating temperature and times within the explicit ranges above are contemplated and are within the present disclosure. As a result of the heat treatment, hydrolysis, and densification of the coating material, the coating material can exhibit an increase in index of refraction and in absorption of radiation without significant loss of contrast.

Following condensation, drying, and potentially hydrolysis, the coating material can be finely patterned using radiation. As noted above, the composition of the precursor solution and thereby the corresponding coating material can be designed for sufficient absorption of a desired form of radiation, with a particular interest with respect to EUV radiation. The absorption of the radiation results in energy that can break the bonds between the metal and alkyl ligands so that at least some of the alkyl ligands are no longer available to stabilize the material. With alkyltin ligands, the modifications caused by the radiation are potentially less clear, but the compositions are observed to provide good patterning properties. Similarly, absorption of the radiation can also break the bonds between the metal and carboxylate ligands and/or decompose the carboxylate ligands. Radiolysis products, including alkyl ligands or other fragments may diffuse out of the film, or not, depending on process variables and the identity of such products. With the absorption of a sufficient amount of radiation, the exposed coating material condenses, i.e. forms an enhanced metal oxo-hydroxo network, which may involve additional water absorbed from the ambient atmosphere. The radiation generally can be delivered according to a selected pattern. The radiation pattern is transferred to a corresponding pattern or latent image in the coating material with irradiated areas and un-irradiated areas. The irradiated areas comprise chemically altered coating material, and the un-irradiated areas comprise generally the as-formed coating material. As noted below, very smooth edges can be formed upon development of the coating material with the removal of the un-irradiated coating material or alternatively with selective removal of the irradiated coating material.

Radiation generally can be directed to the coated substrate through a mask or a radiation beam can be controllably scanned across the substrate. In general, the radiation can comprise electromagnetic radiation, an electron-beam (beta radiation), or other suitable radiation. In general, electromagnetic radiation can have a desired wavelength or range of wavelengths, such as visible radiation, ultraviolet radiation, or X-ray radiation. The resolution achievable for the radiation pattern is generally dependent on the radiation wavelength, and a higher resolution pattern generally can be achieved with shorter wavelength radiation. Thus, it can be desirable to use ultraviolet light, X-ray radiation, or an electron-beam to achieve particularly high resolution patterns.

Following International Standard ISO 21348 (2007) incorporated herein by reference, ultraviolet light extends between wavelengths of greater than or equal to 100 nm and less than 400 nm. A krypton fluoride laser can be used as a source for 248 nm ultraviolet light. The ultraviolet range can be subdivided in several ways under accepted Standards, such as extreme ultraviolet (EUV) from greater than or equal 10 nm to less than 121 nm and far ultraviolet (FUV) from greater than or equal to 122 nm to less than 200 nm. A 193 nm line from an argon fluoride laser can be used as a radiation source in the FUV. EUV light at 13.5 nm has been used for lithography, and this light is generated from a Xe or Sn plasma source excited using high energy lasers or discharge pulses. Soft x-rays can be defined from greater than or equal to 0.1 nm to less than 10 nm.

The amount of electromagnetic radiation can be characterized by a fluence or dose which is defined by the integrated radiative flux over the exposure time. Suitable radiation fluences can be from about 1 $mJ/cm^2$ to about 175 $mJ/cm^2$, in further embodiments from about 2 $mJ/cm^2$ to about 150 $mJ/cm^2$, and in further embodiments from about 3 $mJ/cm^2$ to about 125 $mJ/cm^2$. A person of ordinary skill in the art will recognize that additional ranges of radiation fluences within the explicit ranges above are contemplated and are within the present disclosure.

Based on the design of the coating material, there can be a large contrast of material properties between the irradiated regions that have condensed coating material and the un-irradiated, coating material with substantially intact organic or carboxylate ligands. For embodiments in which a post irradiation heat treatment is used, the post-irradiation heat treatment can be performed at temperatures from about 45° C. to about 250° C., in additional embodiments from about 50° C. to about 190° C. and in further embodiments from about 60° C. to about 175° C. The post exposure heating can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of post-irradiation heating temperature and times within the explicit ranges above are contemplated and are within the present disclosure. This high contrast in material properties further facilitates the formation of high-resolution lines with smooth edges in the pattern following development as described in the following section.

For the negative tone imaging, the developer can be an organic solvent, such as the solvents used to form the precursor solutions. In general, developer selection can be influenced by solubility parameters with respect to the coating material, both irradiated and non-irradiated, as well as developer volatility, flammability, toxicity, viscosity and potential chemical interactions with other process material. In particular, suitable developers include, for example, alcohols (e.g., 4-methyl-2-pentanol, 1-butanol, isopropanol, 1-propanol, methanol), ethyl lactate, ethers (e.g., tetrahydrofuran, dioxane, anisole), ketones (pentanone, hexanone, 2-heptanone, octanone). and the like. The development can be performed for about 5 seconds to about 30 minutes, in further embodiments from about 8 seconds to about 15 minutes and in additional embodiments from about 10 seconds to about 10 minutes. A person of ordinary skill in the art will recognize that additional ranges within the explicit ranges above are contemplated and are within the present disclosure.

In addition to the primary developer composition, the developer can comprise additional compositions to facilitate the development process. Suitable additives may include, for example, viscosity modifiers, solubilization aids, or other processing aides. If the optional additives are present, the developer can comprise no more than about 10 weight percent additive and in further embodiments no more than about 5 weight percent additive. A person of ordinary skill in the art will recognize that additional ranges of additive concentrations within the explicit ranges above are contemplated and are within the present disclosure.

With a weaker developer, e.g., diluted organic developer or compositions in which the coating has a lower development rate, a higher temperature development process can be used to increase the rate of the process. With a stronger developer, the temperature of the development process can be lower to reduce the rate and/or control the kinetics of the development. In general, the temperature of the development can be adjusted between the appropriate values consistent with the volatility of the solvents. Additionally, developer with dissolved coating material near the developer-coating interface can be dispersed with ultrasonication during development.

The developer can be applied to the patterned coating material using any reasonable approach. For example, the developer can be sprayed onto the patterned coating material. Also, spin coating can be used. For automated processing, a puddle method can be used involving the pouring of the developer onto the coating material in a stationary format. If desired spin rinsing and/or drying can be used to complete the development process. Suitable rinsing solutions include, for example, ultrapure water, aqueous tetraalkyl ammonium hydroxide, methyl alcohol, ethyl alcohol, propyl alcohol and combinations thereof. After the image is developed, the coating material is disposed on the substrate as a pattern.

After completion of the development step, the coating materials can be heat treated to further condense the material and to further dehydrate, densify, or remove residual developer from the material. This heat treatment can be particularly desirable for embodiments in which the oxide coating material is incorporated into the ultimate device, although it may be desirable to perform the heat treatment for some embodiments in which the coating material is used as a resist and ultimately removed if the stabilization of the coating material is desirable to facilitate further patterning. In particular, the bake of the patterned coating material can be performed under conditions in which the patterned coating material exhibits desired levels of etch selectivity. In some embodiments, the patterned coating material can be heated to a temperature from about 100° C. to about 600° C., in further embodiments from about 175° C. to about 500° C. and in additional embodiments from about 200° C. to about 400° C. The heating can be performed for at least about 1 minute, in other embodiment for about 2 minutes to about 1 hour, in further embodiments from about 2.5 minutes to about 25 minutes. The heating may be performed in air, vacuum, or an inert gas ambient, such as Ar or $N_2$. A person of ordinary skill in the art will recognize that additional ranges of temperatures and time for the heat treatment within the explicit ranges above are contemplated and are within the present disclosure. Likewise, non-thermal treatments, including blanket UV exposure, or exposure to an oxidizing plasma such as 02 may also be employed for similar purposes.

In some embodiments, adjacent linear segments of neighboring structures can have an average pitch (half-pitch) of no more than about 60 nm (30 nm half-pitch), in some embodiments no more than about 50 nm (25 nm half-pitch) and in further embodiments no more than about 34 nm (17 nm half-pitch). Pitch can be evaluated by design and confirmed with scanning electron microscopy (SEM), such as with a top-down image. As used herein, pitch refers to the spatial period, or the center-to-center distances of repeating structural elements, and as generally used in the art a half-pitch is a half of the pitch. Feature dimensions of a pattern can also be described with respect to the average width of the feature, which is generally evaluated away from corners or the like. Also, features can refer to gaps between material elements and/or to material elements. In some embodiments, average widths can be no more than about 25 nm, in further embodiments no more than about 20 nm, and in additional embodiments no more than about 15 nm. A person of ordinary skill in the art will recognize that additional ranges of pitch and average widths within the explicit ranges above are contemplated and are within the present disclosure. Based on these processes, the patterning can be adapted to the formation of various devices such as electronic integrated circuits, generally through the repeated patterning process to form appropriately layered structures, such as transistors or other components.

Wafer throughput is a substantially limiting factor for implementation of EUV lithography in high-volume semiconductor manufacturing, and is directly related to the dose required to pattern a given feature. However, while chemical strategies exist to reduce imaging dose, a negative correlation between the imaging dose required to print a target feature, and feature size uniformity (such as LWR) is commonly observed for EUV photoresists at feature sizes and pitches <50 nm, thereby limiting final device operability and wafer yields. Patterning capability can be expressed in terms of the dose-to-gel value. Imaging dose requirements can be evaluated by forming an array of exposed pads in which the exposure time is stepped from pad to pad to change the dosing of the exposure. The film can then be developed, and the thickness of the remaining resist can be evaluated for all of the pads, for example, using spectroscopic ellipsometry.

The measured thicknesses can be normalized to the maximum measured resist thickness and plotted versus the logarithm of exposure dose to form characteristic curves. The maximum slope of the normalized thickness vs log dose curve is defined as the photoresist contrast (y) and the dose value at which a tangent line drawn through this point equals 1 is defined as the photoresist dose-to-gel, ($D_g$). In this way common parameters used for photoresist characterization may be approximated following Mack, C. Fundamental Principles of Optical Lithography, John Wiley & Sons, Chichester, U.K; pp 271-272, 2007.

EXAMPLES

| Reagent | Source |
| --- | --- |
| phenylacetylene | Sigma Aldrich, 98% |
| isopropylmagnesium chloride | Sigma Aldrich, 2.0M in diethyl ether |
| (chloromethyl)trimethlystannane | Gelest, >95% |
| triethylamine trihydrofluoride | Simga Aldrich, 98% |
| formic acid | Sigma Aldrich, >98% |

| Solvent | Source |
| --- | --- |
| pentane | Sigma Aldrich, anhydrous |
| chloroform | Sigma Aldrich, anhydrous |
| methanol-d4 | Sigma Aldrich, 99.8 atom % |
| methanol | Sigma Aldrich, anhydrous |
| tetrahydrofuran | Sigma Aldrich, anhydrous |

Example 1. Preparation, Analysis, and EUV Exposure of $((CH_3)_3SnCH_2Sn)_{12}O_{14}(OH)_6(HCO_2)_2$ Dodecamer Synthesis of monomer $(C_6H_5CC)_3SnCH_2Sn(CH_3)_3$. A 100-mL round-bottom flask equipped with a magnetic stir bar was charged with 1.6 g of phenylacetylene and 15 mL tetrahydrofuran. The solution was cooled to 0° C., and then 7.7 mL of a 2-M solution of isopropyl magnesium chloride in ether was added dropwise. After the addition of the isopropyl magnesium chloride solution, the resulting solution was heated to 50° C. for 10 minutes followed by removal of ether under vacuum. The solution following removal of the ether was cooled and added dropwise to a solution of $SnCl_2$ (1.0 g) in tetrahydrofuran (15 mL) at −40° C. The mixture was warmed to 25° C. and stirred for 14 hours; (chloromethyl)trimethyl stannane (2 g) was then added. The solution was then stirred at 25° C. for 1 hour and subsequently concentrated under vacuum to 4 mL. Ether (20 mL) was added to the concentrated solution to produce a precipitate that was recovered by filtration. The precipitate was washed with ether to yield 2.5 g of $(C_6H_5CC)_3SnCH_2Sn(CH_3)_3$ (FIG. 1) as a white powder. The product can be further purified by recrystallization from a hydrocarbon solvent such as pentane or hexanes. The —$CH_2Sn(CH_3)_3$ group in this monomer structure becomes the R group of the general dodecamer structure. The product was characterized by NMR: $^{119}$Sn NMR (500 MHz, $CDCl_3$) δ24.42, −220.74.

Preparation of dodecamer $((CH_3)_3SnCH_2Sn)_{12}O_{14}(OH)_6(HCO_2)_2$. A 10-mL round-bottom flask equipped with a magnetic stir bar was charged with 1 g of (trimethyl stannanyl)-tris(phenylethynyl) stannane from the previous synthesis, 8 mL tetrahydrofuran, and 0.1 mL water. The solution was stirred at room temperature for 3 days. After 3 days, 0.04 mL formic acid was added, and the resulting solution stirred for 10 min. The solution was then concentrated under vacuum followed by addition of ether (5 mL) to produce a slurry. The precipitate was recovered by filtration and dried under vacuum to yield 0.3 g of $((CH_3)_3SnCH_2Sn)_{12}O_{14}(OH)_6 (HCO_2)_2$ as a white powder. The product was characterized by NMR: $^{119}$Sn NMR (500 MHz, $CDCl_3$) δ19.7, −255.4, −457.16. The powder produced x-ray diffraction peaks indicating that the powder was crystalline.

Film deposition and EUV contrast. 0.1142 g of the dodecameric solid from the above synthesis was dissolved by stirring in 12 mL chloroform (HPLC >99.8%) to form a photoresist coating solution with a total Sn concentration of 0.06 M.

Thin films were deposited on silicon wafers (100 -mm diameter) with a native-oxide surface. The 0.06-M precursor solution was dispensed via pipette onto the substrates, spin-coated at 2000 rpm, and then baked on a hotplate for 2 min at 100° C. Film thickness was measured via ellipsometry to be 29 nm.

Figure 2:
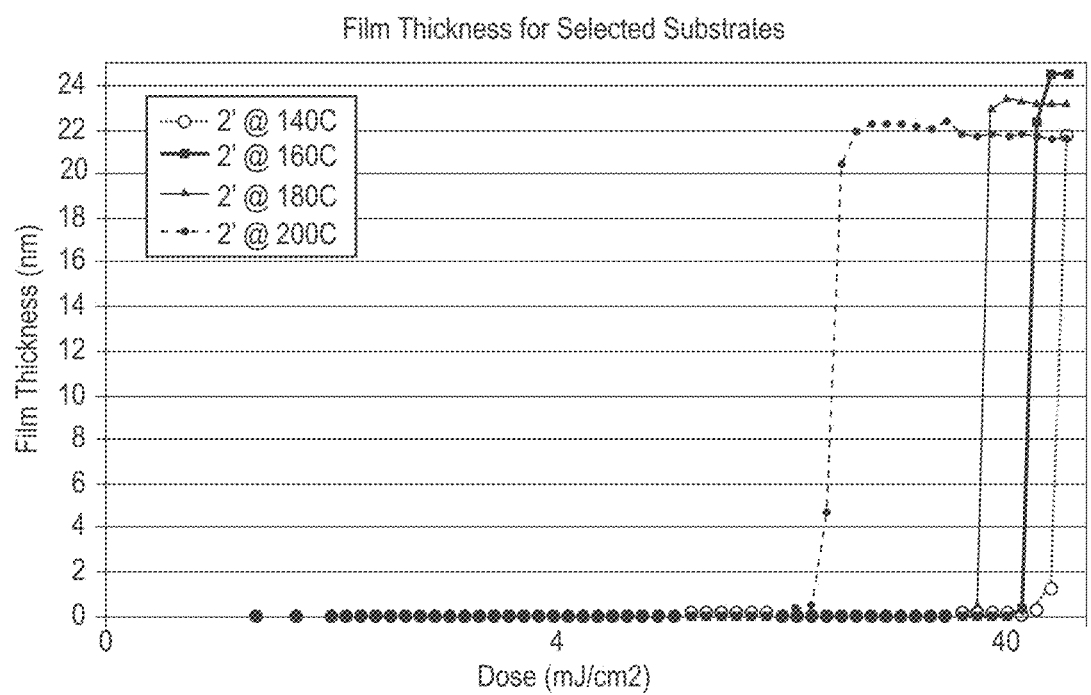
FIG. 2 is a plot of contrast curves for $((CH_3)_3SnCH_2Sn)_{12}O_{14}(OH)_6(HCO_2)_2$ exposed to EUV radiation.

A linear array of 50 circular pads, ~500 µm in diameter was projected onto the wafer with EUV light on the Dose Calibration Tool (DCT) at Lawrence Berkeley National Laboratory. Pad exposure times were modulated to deliver an increasing EUV dose (8% exponential step) to each pad. Resist and substrate were then subjected to a post-exposure bake (PEB) on a hotplate for 2 minutes at selected temperatures in the range 140-200° C. The exposed and baked films were then dipped in 2-heptanone for 15 seconds and rinsed an additional 15 seconds with the same developer to form a negative tone image, i.e., unexposed and low-dose portions of the coating were removed. A final 150° C., 2 min hotplate bake was performed to complete the process. Residual resist thicknesses of the exposed pads were measured with a J. A. Woollam M-2000 Spectroscopic Ellipsometer. FIG. 2 shows the measured thickness of each pad versus dose for four wafers subjected to PEBs in the temperature range 140-200° C. By normalizing the thickness to the maximum measured resist thickness and plotting the normalized value versus the logarithm of exposure dose, a characteristic curve may be generated for each process condition. The maximum slope of a normalized thickness vs log dose curve is defined as the photoresist contrast ($\gamma$), and the intersection of the maximum resist thickness and the line tangent to the point of maximum slope defines the dose-to-gel (Dg). In this way, common parameters for assessment of photoresist performance may be determined, see Mack, C. (2007) Introduction to Semiconductor Lithography, in Fundamental Principles of Optical Lithography: The Science of Microfabrication, John Wiley & Sons, Ltd, Chichester, UK. Table 2 summarizes contrast values and Dg values for the photoresist at four PEB temperatures for $((CH_3)_3SnCH_2Sn)_{12}O_{14}(OH)_6(HCO_2)_2$.

TABLE 2

| PEB Temperature (° C.) | Dg (mJ/cm$^2$) | Contrast ($\gamma$) |
|---|---|---|
| 140 | >55 | 1.9 |
| 160 | 46.1 | 18.8 |
| 180 | 40.3 | 14.5 |
| 200 | 18.3 | 13.4 |

Example 2. Preparation and Characterization of $(t\text{-}BuSn)_{12}O_{14}(OH)_6(HCO_2)_2$ Dodecamer $(t\text{-}BuSn)_{12}O_{14}(OH)_6(HCO_2)_2$ was prepared from the monomer phenylacetylide $t\text{-}BuSn(CCPh)_3$ as follows. A 2-L round-bottom flask (RBF) is purged with nitrogen and charged with 308 g of $t\text{-}BuSn(NMe_2)_2$ dissolved in 500 mL pentane. A bubbler was attached to the RBF such that it ran through a trap containing aqueous acetic acid. A slight excess of phenylacetylene (337 g, 3.3 eq) was added dropwise while the temperature was maintained below 40° C. with an ice bath. The solution was allowed to react overnight, after which a crystalline precipitate formed. The $t\text{-}BuSn(CCPh)_3$ crystals were collected and recrystallized in pentane (92% yield).

A 100 mL round-bottom flask was charged with 6 g $t\text{-}BuSn(CCPh)_3$, 60 mL tetrahydrofuran, and 0.6 mL water. After homogenization, the solution was cured 3 days, after which time crystals formed. The solution was heated to boiling, then formic acid (118 mg) was added dropwise to form a precipitate. The slurry was filtered hot and recrystallized in 25 mL methanol at −20° C. (80% yield).

Figure 3:
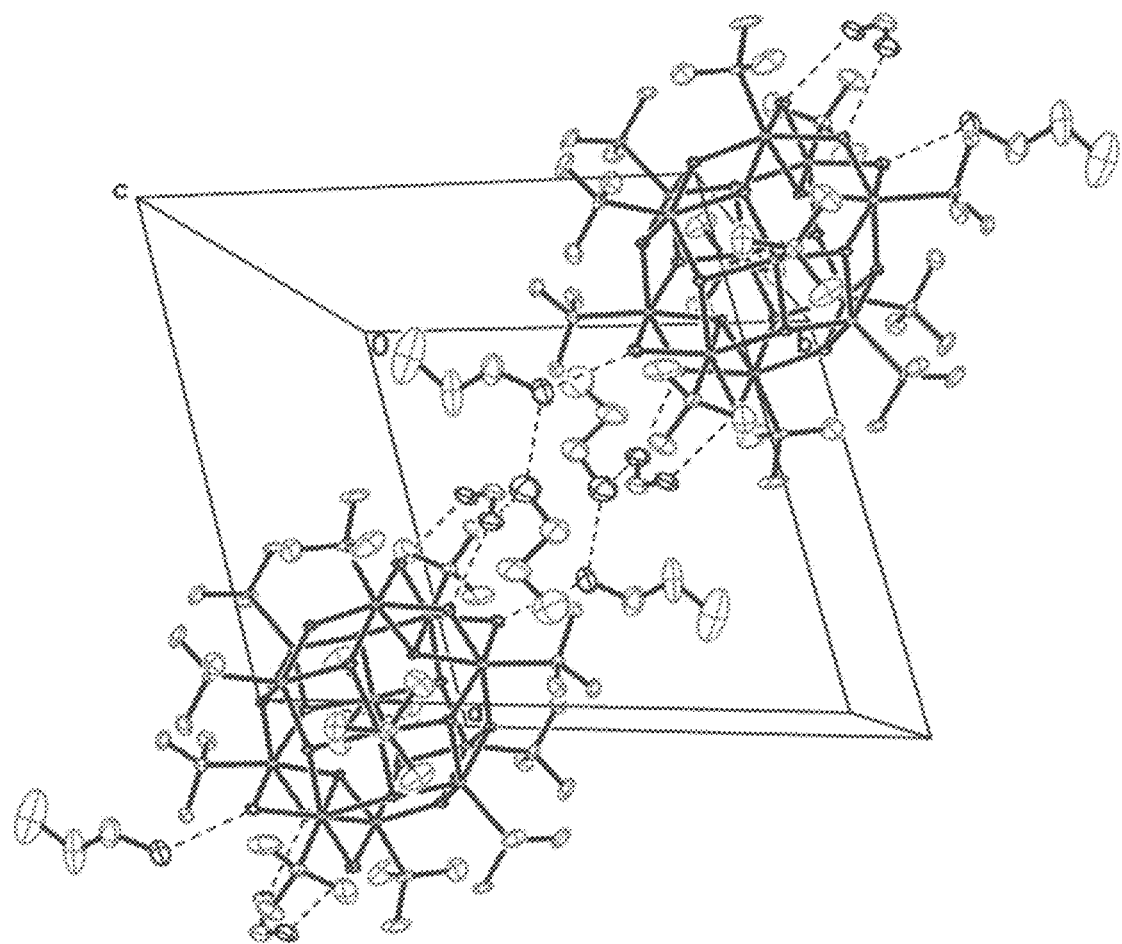
FIG. 3 is a drawing of the crystal structure of $(t\text{-}BuSn)_{12}O_{14}(OH)_6(HCOO)_2 \cdot 4n\text{-}C_3H_5OH$.
Figure 4:
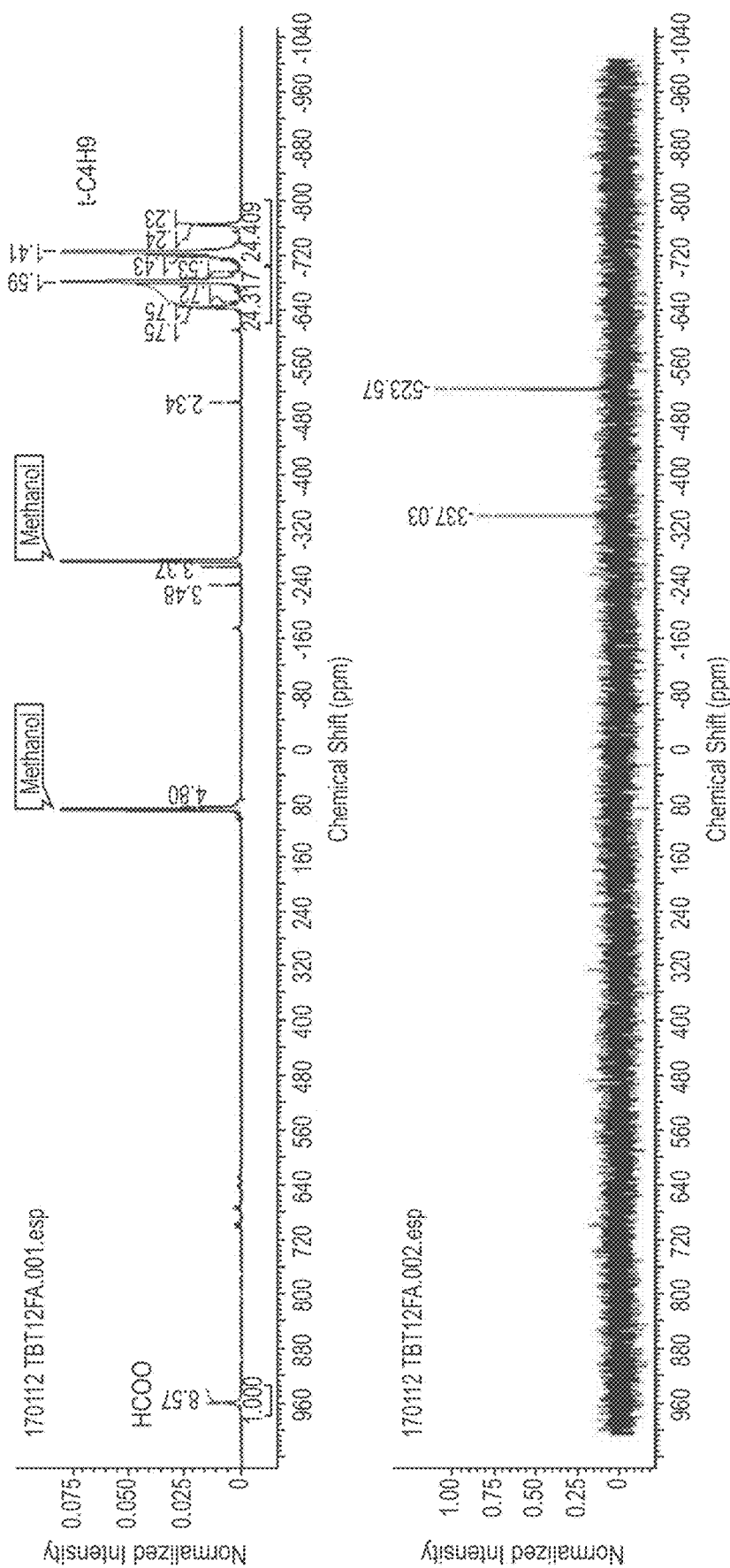
FIG. 4 is $^1H$ (top) and $^{119}Sn$ (bottom) NMR spectra of $(t\text{-}BuSn)_{12}O_{14}(OH)_6(HCO_2)_2$ in $CH_3OH$-d4.

Single crystals were grown by recrystallization of the above cluster in n-propanol. FIG. 3 shows the molecular structure of the $(t\text{-}BuSn)_{12}O_{14}(OH)_6(HCO_2)_2$ cluster determined by single-crystal X-ray diffraction methods. FIG. 4 shows the cluster's $^1H$ (top) and $^{119}Sn$ (bottom) NMR spectra in MeOH-d4. The signals at −337.03 ppm and −523.57 ppm in the $^{119}Sn$ spectrum correspond to the five- and six-coordinate Sn atoms, respectively, in the molecular structure.

Figure 5:
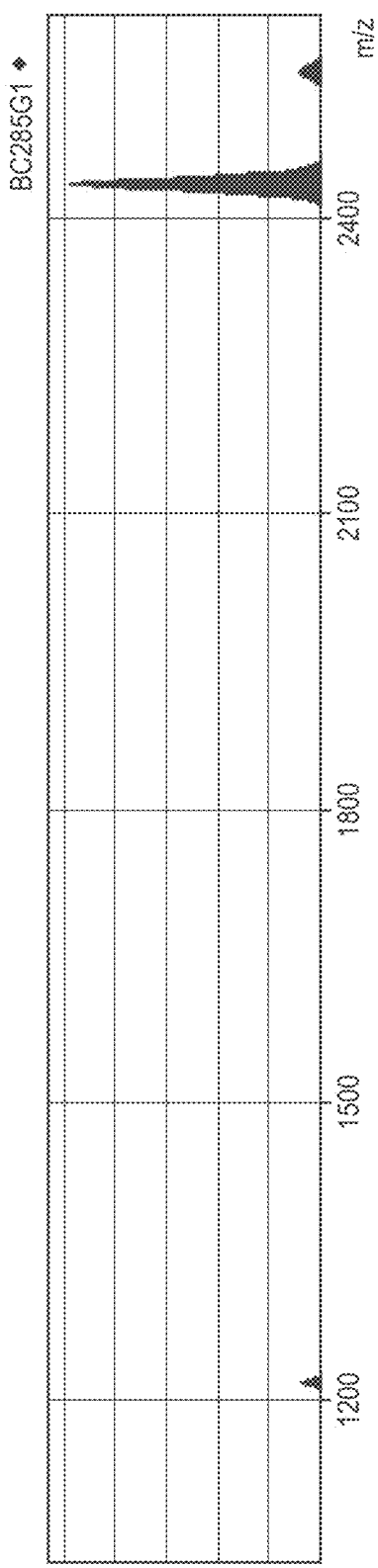
FIG. 5 is ESI mass spectra of $(t\text{-}BuSn)_{12}O_{14}(OH)_6(HCO_2)_2$.
Figure 6:
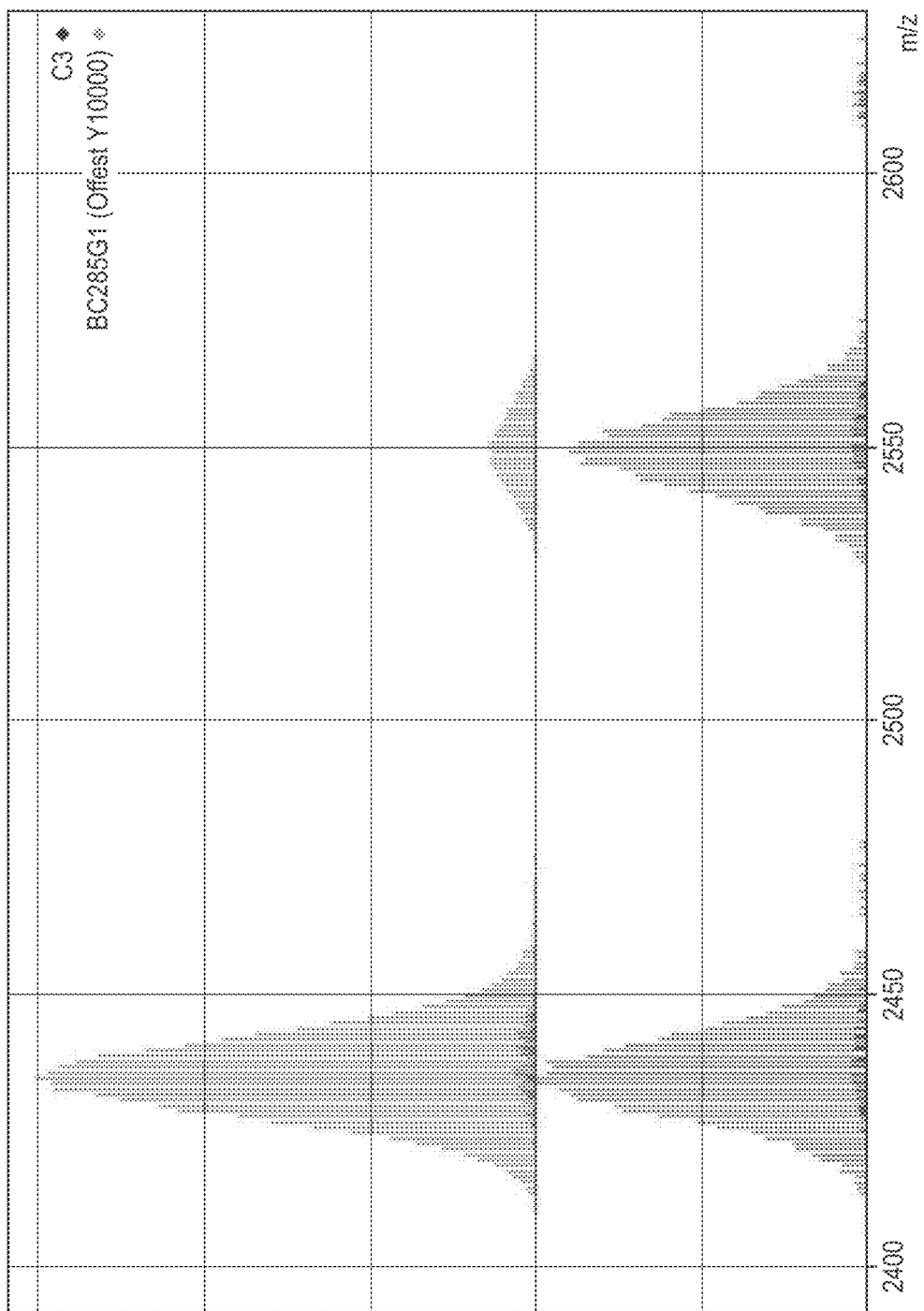
FIG. 6 is an expanded version of FIG. 5.

A small quantity of $(t\text{-}BuSn)_{12}O_{14}(OH)_6(HCO_2)_2$ (~1% by mass) was dissolved in a mobile phase of 0.5% acetic acid in methanol and then injected into an Agilent 6510 QTOF mass spectrometer. FIGS. 5 and 6 show peaks that are consistent with fragments of $(t\text{-}BuSn)_{12}O_{14}(OH)_6(O_2CH)_2$: $(t\text{-}BuSn)_{12}O_{14}(OH)_6^{2+}$ [1217 u], $(t\text{-}BuSn)_{12}O_{15}(OH)_5^{1+}$ [2434 u] and $(t\text{-}BuSn)_{12}O_{14}(OH)_6 \cdot 2[H_2O][HOCH_3][HCOOH]^+$ [2548 u].

Example 3. Preparation, Analysis, and EUV Exposure of $(t\text{-}BuSn)_{12}O_{14}F_8$ and $(t\text{-}BuSn)_{12}O_{14}(OH)_{8-x}F_x$ (0<x<8)

Synthesis. A 20-mL round-bottom flask was charged with 0.5 g of the dodecamer $(t\text{-}BuSn)_{12}O_{14}(OH)_6(HCO_2)_2$ from the synthesis in Example 2 that was dissolved in 10 mL of methanol. Approximately 7.3 parts triethylamine trihydrofluoride (0.25 g) per dodecamer were added and the solution allowed to stand. After one week, crystals were recovered in 10% yield. Analytical calculation for $(t\text{-}BuSn)_{12}O_{14}F_8$ $(Sn_{12}C_{48}H_{108}F_8O_{14})$: C, 23.2; H, 4.4; F, 6.1. Found: C, 23.3; H, 4.4; F, 6.0. The addition of fewer than 2.67 parts triethylamine trihdydrofluoride per dodecamer produces a product with a smaller F:Sn ratio.

Figure 7:
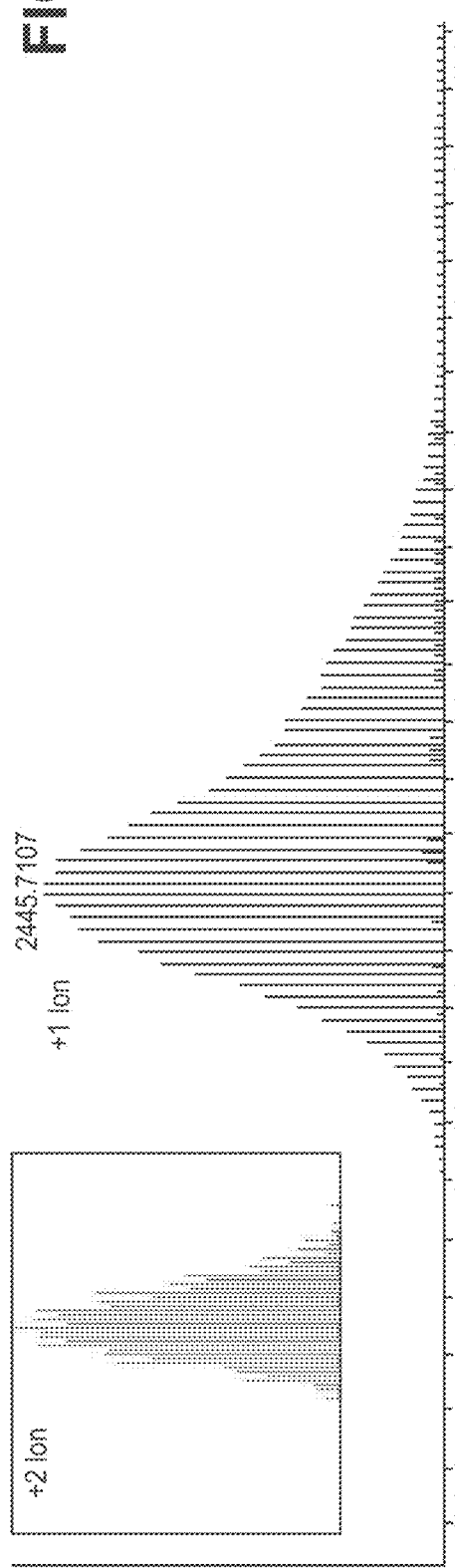
FIG. 7 is a mass spectrum of $(t\text{-}BuSn)_{12}O_{14}(OH)_{8-x}F_x$.
Figure 8:
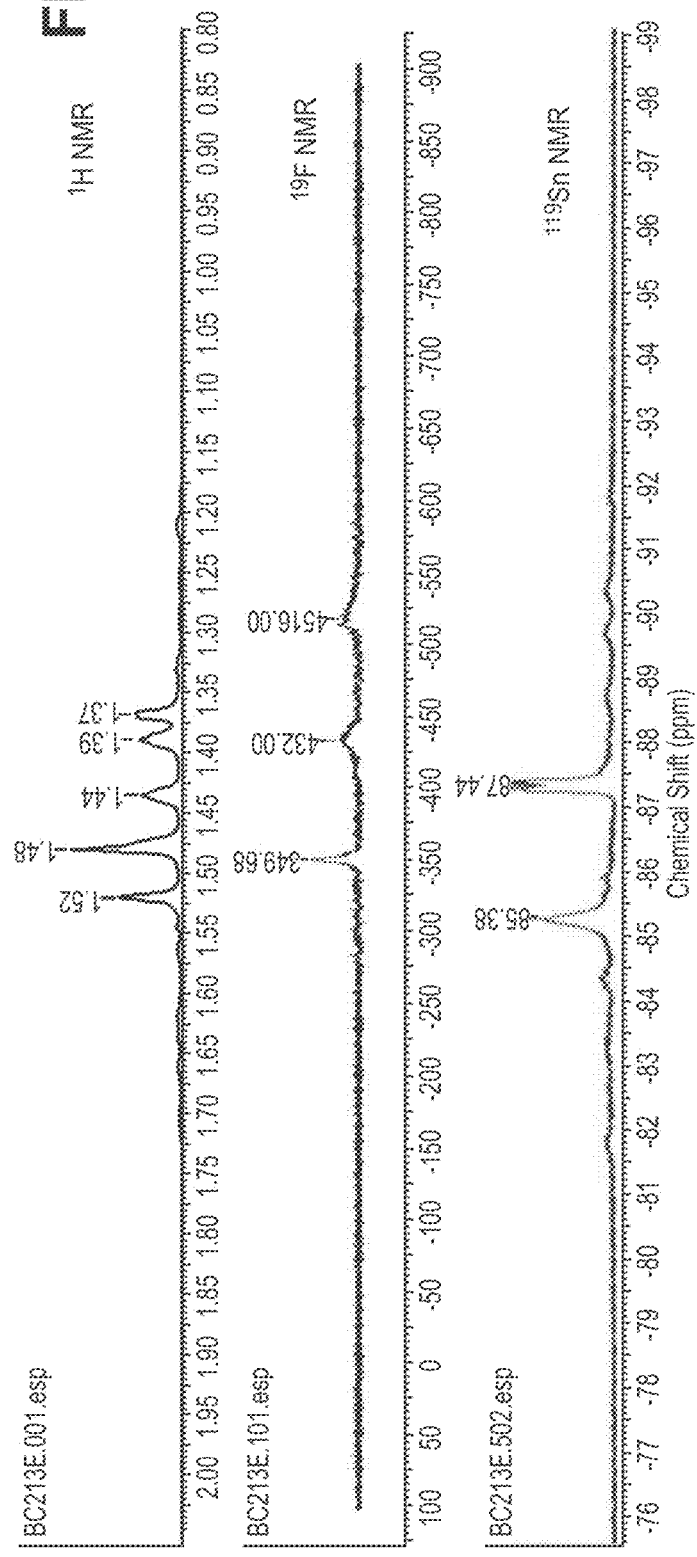
FIG. 8 is NMR spectra for $(t\text{-}BuSn)_{12}O_{14}F_8$ dodecamer, including $^1H$, $^{19}F$, $^{119}Sn$ NMR (400 MHz) in $CDCl_3$.

Mass Spectral Analysis. The synthesis product was dissolved in methanol (~1% by mass) and injected into an Agilent 6510 QTOF mass spectrometer. FIG. 7 shows peaks consistent with species containing a distribution of fluorine and oxygen in the dodecamer. The highest intensity signal is consistent with the singly-ionized, deprotonated cluster $[(t\text{-}BuSn)_{12}O_{15}(OH)F_5]^+$. NMR spectra are shown in FIG. 8: NMR spectra. $^1H$, $^{19}F$, $^{119}Sn$ NMR (400 MHz) in CDCl$_3$ show signals consistent with the $(t\text{-}BuSn)_{12}O_{14}F_8$ dodecamer.

Figure 9:
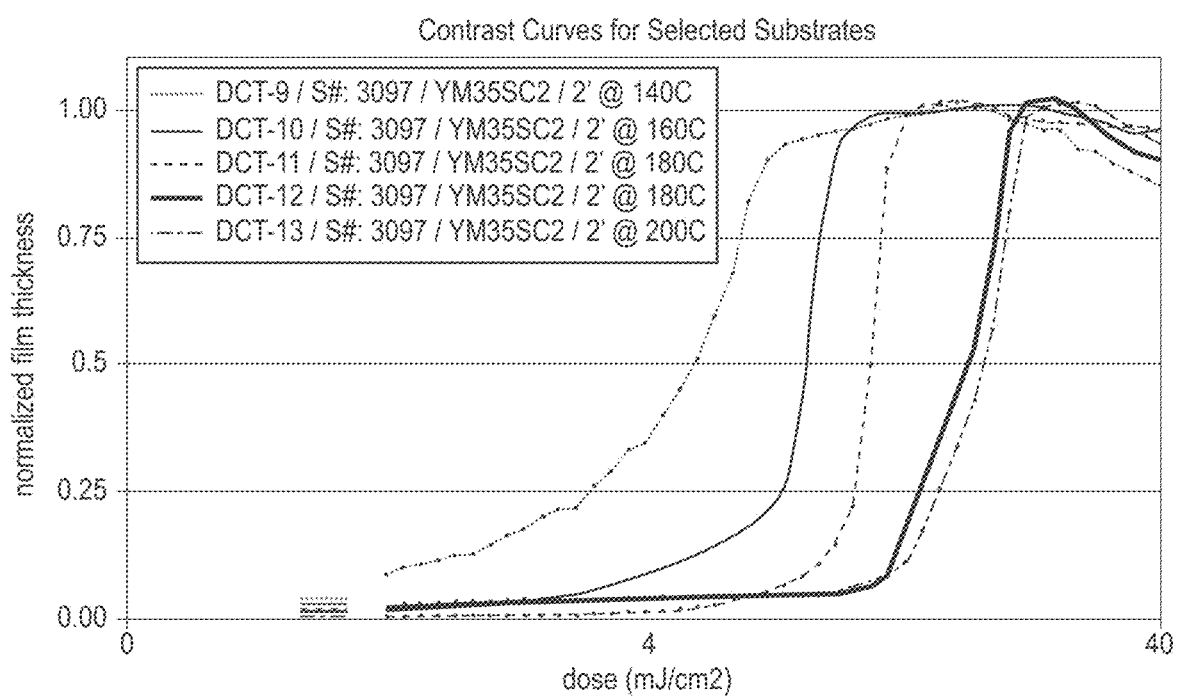
FIG. 9 is a plot of contrast curves for EUV exposure of $(t\text{-}BuSn)_{12}O_{14}F_8$.

Coating solution, film deposition, and EUV exposure contrast. The fluorinated dodecamer synthesis product was dissolved in chloroform (0.035-M Sn), coated at 1500 rpm on SiO$_2$/Si wafers via spin coating, baked at 100° C., and exposed on the EUV Dose Contrast Tool at Lawrence Berkeley National Laboratories following the procedure described in Example 1. After exposure, films were baked at selected temperatures between 140 and 200° C. (with specific temperatures for each samples specified in the figure) and then developed in 2-heptanone. The thickness of each exposure pad was evaluated optically, and then plotted vs. exposure dose to determine contrast values (FIG. 9). Table 3 summarizes derived parameters $D_g$, $D_0$, and contrast obtained from FIG. 9 for (t-BuSn)$_{12}$O$_{14}$F$_8$. Do corresponds to the onset dose for initial increase in film thickness for a negative-tone resist.

TABLE 3

| Substrate ID | D$_g$ (mJ/cm$^2$) | D$_0$ (mJ/cm$^2$) | Contrast | tmax (nm) | tmin (nm) | tfield (nm) |
| --- | --- | --- | --- | --- | --- | --- |
| DCT-9 | 12.2 | 9.7 | 10.0 | 15.03 | 0.01 | 0.02 |
| DCT-10 | 9.3 | 6.9 | 7.6 | 15.31 | 0.21 | 0.18 |
| DCT-11 | 22.3 | 14.6 | 5.4 | 16.17 | 0.39 | 0.43 |
| DCT-12 | 20.9 | 14.4 | 6.2 | 16.26 | 0.35 | 0.37 |
| DCT-13 | 7.3 | 3.5 | 3.1 | 16.23 | 1.53 | 0.54 |

Example 4. Preparation and Film Deposition of Resist Based on (t-BuSn)$_{12}$O$_{14}$(OH)$_6$(HCOO)$_2$ A 0.070 M Sn solution of (t-BuSn)$_{12}$O$_{16}$(OH)$_6$(HCO$_2$)$_2$, prepared according to Example 2, was prepared by dissolving 1.4735 g of the Sn dodecamer in 100 mL of 10% v/v formic acid in methyl isoamyl ketone. The formic acid provides stability for the solution as well as improving solubility and coating quality.

10.2-cm diameter circular silicon wafers with a native-oxide surface were used as substrates for film deposition. Films of dodecamer were spin coated onto the Si wafers at 1500 RPM for 45 seconds. Selected wafers were then baked at 100° C. for 120 seconds. Film thickness following coating and baking was measured via ellipsometry to be approximately 20 nm. All films exhibit root-mean-square surface roughness <0.5 nm, as measured by atomic force microscopy.

Example 5. EUV Exposure Contrast and Line-Space Imaging for (t-BuSn)$_{12}$O$_{16}$(OH)$_2$(HCO$_2$)$_2$ Dodecamer 300-mm Si wafers having a native oxide surface were coated with resists prepared according to Example 4. Films were spin coated at 1500 RPM and baked at 100° C. for 20 seconds. Films were then exposed to extreme ultraviolet radiation on an ASML NXE:3300B scanner. Contrast arrays were generated in the film by projecting an 11×11 array of pads with an increasing EUV photon dose at subsequent pad. A repeating pattern of 16 nm lines on a 32 nm pitch was also projected on the films with dipole 90x illumination and a numerical aperture of 0.33. Exposed resist films and substrates were then subjected to a post-exposure bake (PEB) on a hotplate in air for 2 min at selected temperatures between 120° C. and 180° C. After the PEB, the films were developed in 2-heptanone for 15 seconds and rinsed an additional 15 seconds with the same developer to form a negative tone image, i.e., unexposed portions of the coating were removed during development. A final 5-min hotplate bake at 150° C. in air was performed after development.

Figure 10:
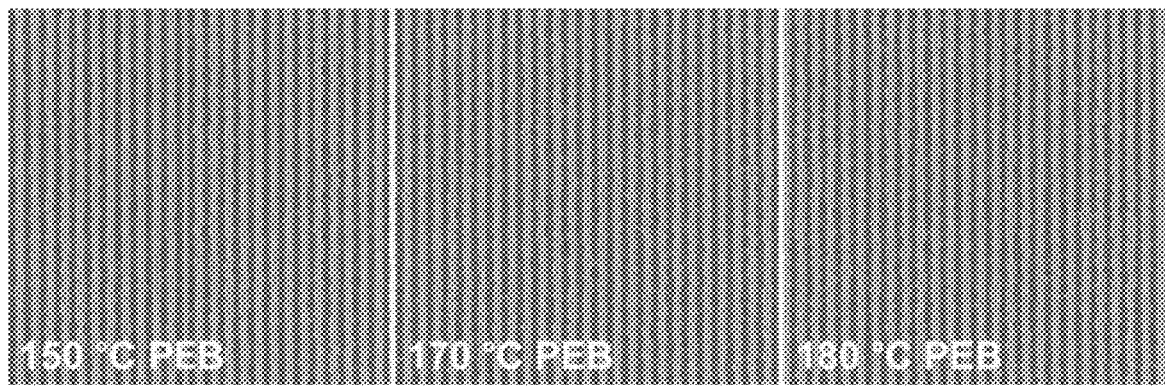
FIG. 10 is scanning electron microscope (SEM) images of 16 nm resist lines printed on a 32 nm pitch for resist based on $(t\text{-}BuSn)_{12}O_{14}(OH)_6(HCO_2)_2$.
Figure 11:
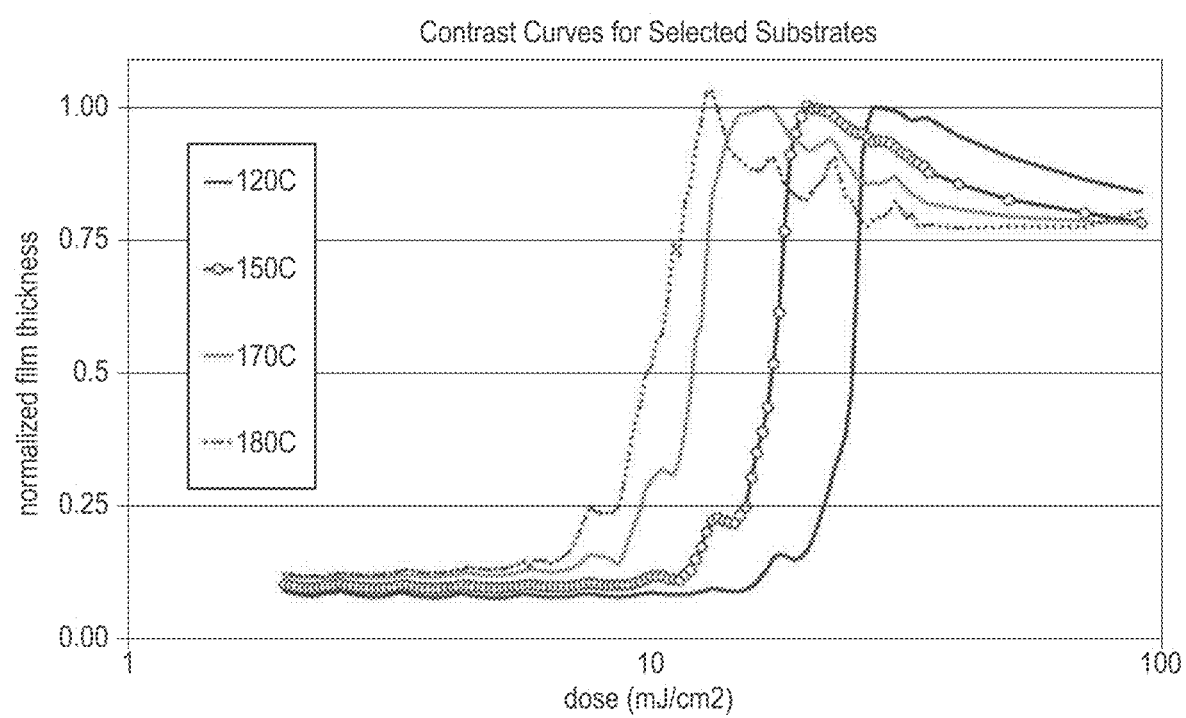
FIG. 11 is a plot of characteristic contrast curves for resist based on $(t\text{-}BuSn)_{12}O_{14}(OH)_6(HCO_2)_2$ processed at indicated post exposure bake temperatures.

Line-space patterns were imaged with a Hitachi CG5000 CD-SEM. FIG. 10 shows images for resist lines, formed with (t-BuSn)$_{12}$O$_{14}$(OH)$_6$(HCO$_2$)$_2$, as a function of PEB temperature. Table 4 summarizes extracted dose to size and LWR for the patterns. Contrast arrays were analyzed by measuring the residual thickness of each exposed and developed pad via ellipsometry. FIG. 11 shows the thickness of each pad normalized to the initial resist film thickness versus the logarithm of exposure dose, illustrating characteristic curves at PEB temperatures between 120° C. and 180° C. The resulting curves clearly illustrate negative tone contrast generated on exposure; residual pad thickness for each resist film is near 0 nm low doses and then increases nonlinearly, reaching a maximum at dose-to-gel (D$_g$). The dose required to initiate a development rate change is clearly observed to decrease as a function of PEB. Table 4 summarizes D$_g$ and derived contrast value at each PEB temperature.

TABLE 4

| PEB (C) | D$_g$ (mJ/cm$^2$) | contrast value | t$_{MAX}$ (nm) | DtS (mJ/cm$^2$) | LWR (nm) |
| --- | --- | --- | --- | --- | --- |
| 120 | 26.4 | 19.4 | 17.12 | | |
| 150 | 19.2 | 12.8 | 17.05 | 78.7 | 4.1 |
| 170 | 13.8 | 10.3 | 16.61 | 52.4 | 4.76 |
| 180 | 13.0 | 4.5 | 17.55 | 41.6 | 5.2 |

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understood that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated.

What is claimed is:

1. A composition comprising a tin dodecamer represented by the formula (QSn)$_{12}$ O$_{14}$(OH)$_6$(RCO$_2$)$_2$, where R is H or an alkyl group with 1 to 10 carbon atoms, Q is an alkyltin group with a structure —(CH$_2$)$_n$Sn(R$_1$R$_2$R$_3$) with n=1 to 4 and with 4 to 15 total carbon atoms, and R$_1$, R$_2$, and R$_3$ are independently alkyl groups with 1 to 5 carbon atoms.

2. The composition of claim 1 wherein R$_1$, R$_2$, and R$_3$ are each methyl groups, —CH$_3$.

3. The composition of claim 1 wherein Q is —CH$_2$Sn (CH$_3$)$_3$.

4. A solution for forming a radiation patternable coating, the solution comprising an organic solvent and the composition of claim 1.

5. The solution of claim 4 wherein the concentration of tin atoms is from about 1 mM to about 1 M.

6. The solution of claim 5 wherein the organic solvent comprises chloroform.

7. The solution of claim 4 wherein the concentration of tin is from about 10 mM to about 200 mM.

8. The solution of claim 4 wherein Q is —CH$_2$Sn(CH$_3$)$_3$ and wherein the concentration of tin is from about 10 mM to about 200 mM.

9. The solution of claim 4 further comprising 1-30 vol % formic acid, wherein the organic solvent comprises a ketone or an alkoxy alcohol with 4-10 C atoms.

10. The solution of claim 4 wherein the organic solvent comprises propylene glycol methyl ether acetate.

11. A composition comprising (QSn)$_n$O$_{3n/2-1/2x-1/2y}$F$_x$ (OH)$_y$, wherein 1≤n≤12, (0<x+y≤8), and x>0 and wherein Q is an alkyl group with 1 to 16 carbon atoms or an alkyltin group with a structure —CH$_2$Sn(R$_1$R$_2$R$_3$) with 4 to 15 total carbon atoms, and R$_1$, R$_2$, and R$_3$ are independently alkyl groups with 1 to 5 carbon atoms.

12. The composition of claim 11 wherein R$_1$, R$_2$, and R$_3$ are each methyl groups, —CH$_3$.

13. The composition of claim 11 wherein Q is —(CH$_2$)$_n$C(R$_1$R$_2$R$_3$) with n=1 to 4.

14. The composition of claim 11 wherein Q is a tert-butyl group (—C(CH$_3$)$_3$).

15. The composition of claim 11 wherein Q is —CH$_2$Sn(CH$_3$)$_3$.

16. A solution for forming a radiation patternable coating, the solution comprising an organic solvent and the composition of claim 11.

17. The solution of claim 16 wherein the concentration of tin atoms is from about 1 mM to about 1 M.

18. The solution of claim 16 the organic solvent comprises chloroform.

19. The solution of claim 16 wherein Q is a tert-group (—C(CH$_3$)$_3$) or a t-amyl group (—CH$_2$C(CH$_3$)$_3$), and wherein the concentration of tin is from about 10 mM to about 200 mM.

20. The solution of claim 16 wherein Q is —CH$_2$Sn(CH$_3$)$_3$ and wherein the concentration of tin is from about 10 mM to about 200 mM.

21. The solution of claim 16 further comprising 1-30 vol % formic acid, and wherein the solvent comprises a ketone or alkoxy alcohol with 4-10 C atoms.

22. The solution of claim 16 wherein the organic solvent comprises propylene glycol methyl ether acetate.

23. A method to fluorinate a dodecamer tin composition represented by the formula (QSn)$_{12}$ O$_{14}$(OH)$_6$(HCO$_2$)$_2$, where Q is an alkyl group with 5 to 16 total carbon atoms, or Q is an alkyltin group with a structure —(CH$_2$)$_n$Sn(R$_1$R$_2$R$_3$) with n=1 to 4 and with 4 to 15 total carbon atoms, and R$_1$, R$_2$, and R$_3$ independently alkyl groups with 1 to 10 carbon atoms, the method comprising:

reacting an alkyl tin hydroxide with trialkylamine trihydrofluoride.

24. The method of claim 23 wherein the trialkylamine trihydrofluoride is triethylamine trihydrofluoride.

\* \* \* \* \*